(12) United States Patent
Tokunaga

(10) Patent No.: US 6,285,437 B1
(45) Date of Patent: Sep. 4, 2001

(54) METHOD FOR CONTROLLING STAGES, APPARATUS THEREFOR, AND SCANNING TYPE EXPOSURE APPARATUS

(75) Inventor: Masateru Tokunaga, Yokohama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/220,608

(22) Filed: Dec. 28, 1998

Related U.S. Application Data

(63) Continuation of application No. 08/634,036, filed on Apr. 17, 1996, now abandoned.

(51) Int. Cl.[7] ........................... G03B 27/42; G03B 27/54; G03B 27/72; G01B 11/00
(52) U.S. Cl. .......................... 355/53; 355/67; 355/71; 356/400
(58) Field of Search ................... 355/53, 67, 71; 356/400, 401

(56) References Cited

U.S. PATENT DOCUMENTS

| | | | |
|---|---|---|---|
| 4,748,477 | 5/1988 | Isohata et al. | 355/53 |
| 5,155,523 | 10/1992 | Hara et al. | 355/53 |
| 5,194,893 | 3/1993 | Nishi | 355/53 |
| 5,477,304 | 12/1995 | Nishi | 355/53 |
| 5,504,407 * | 4/1996 | Wakui et al. | 318/568.17 |
| 5,539,497 | 7/1996 | Nishi | 355/53 |
| 5,633,720 | 5/1997 | Takahashi | 356/401 |
| 5,663,783 | 9/1997 | Ueda | 355/53 |
| 5,699,145 | 12/1997 | Makinouchi et al. | |
| 5,796,469 * | 8/1998 | Ebinuma | 355/53 |
| 5,822,043 * | 10/1998 | Ebinuma | 355/55 |

FOREIGN PATENT DOCUMENTS

| | | |
|---|---|---|
| 0250964 | 1/1988 | (EP) . |
| 0254871 | 2/1988 | (EP) . |
| 06 34700 | 1/1995 | (EP) . |
| 2131186 | 6/1984 | (GB) . |
| 2249189 | 4/1992 | (GB) . |

OTHER PUBLICATIONS

Jere D. Buckley, "Expanding the Horizons of Optical Projection Lithography", Solid State Technology, (1982), pp. 77–82.

* cited by examiner

*Primary Examiner*—Alan A. Mathews
*Assistant Examiner*—Khaled Brown
(74) *Attorney, Agent, or Firm*—Oliff & Berridge, PLC

(57) ABSTRACT

In a scanning type exposure apparatus, a reticle coarse movement stage 22 and a wafer stage 20 are simultaneously scanned in a predetermined scanning direction or directions, in which a position control system 44 for a reticle fine movement stage detects a positional discrepancy amount between the wafer stage 20 and the reticle fine movement stage 24, and calculates a vibration amount of a vibration-preventive pedestal 12. The both stages 20, 22 are driven and controlled so that positional discrepancy is corrected on the basis of the detected positional discrepancy amount and the calculated vibration amount. Accordingly, even if a vibration occurs on the vibration-preventive pedestal 12 during acceleration for scanning for the stages 20, 22, an error affected by the vibration is taken into consideration, and correction is made at a predetermined time interval so that the positional relationship between the stages 20, 24 becomes a predetermined synchronized relationship.

54 Claims, 4 Drawing Sheets

METHOD FOR CONTROLLING STAGES, APPARATUS THEREFOR, AND SCANNING TYPE EXPOSURE APPARATUS

This is a Continuation of application Ser. No. 08/634,036 filed Apr. 17, 1996, now abandoned. The entire disclosure of the prior application is hereby incorporated by reference herein in its entirety.

FIELD OF THE INVENTION

The present invention relates to a method for controlling stages and an apparatus therefor, in particular, it relates to a method for controlling stages and an apparatus therefor preferable to be used for so-called scanning type exposure apparatuses, in which a pattern on a mask is transferred onto a photosensitive substrate while moving a mask stage and a substrate stage in synchronization in predetermined scanning directions respectively, and it also relates to a scanning type exposure apparatus provided therewith.

DESCRIPTION OF THE RELATED ART

Recently, an exposure method of the slit scan system has been developed, in which a photosensitive substrate is successively exposed with a pattern on a reticle by illuminating a part of a pattern area on a mask (reticle) in a shape of slit or a shape of circular arc, scanning the reticle with respect to the illuminated area, and scanning the photosensitive substrate in synchronization with the scanning for the reticle with respect to an area (exposure area) conjugate with the illuminated area relative to a projection optical system. A scanning type exposure apparatus which adopts this system has an advantage that a projected image is prevented from distortion, and illuminance can be easily made uniform because the illumination area on the reticle is smaller than that of an exposure apparatus of the full-wafer exposure system, for example, of the step-and-repeat system, and only a part of an image field of the projection optical system is used for exposure. Such a scanning type exposure apparatus is provided with a substrate stage on which the substrate is placed, and a reticle stage (mask stage) on which the reticle is placed. During scanning exposure, it is necessary to make control so that the both stages are simultaneously accelerated in opposite directions or in an identical direction, and each of velocities of the stages after completion of the acceleration is synchronized.

FIG. 4 schematically shows an example of arrangement of a system for controlling stages of a conventional scanning type projection exposure apparatus used in semiconductor production steps.

In this scanning type exposure apparatus, a laser interferometer 70 for wafer and a laser interferometer 72 for reticle are used to detect positions of a wafer stage (substrate stage) 74 and a reticle stage (mask stage) 76 respectively, and these stages 74, 76 are simultaneously subjected to velocity control. As shown in FIG. 4, a positional error between the both stages 74, 76, which is obtained from outputs of the both interferometers 70, 72, is sent in a feedback manner to one of velocity-instructing units for any of the stages, for example, to a velocity-instructing unit 78 for the reticle stage 76. The velocity-instructing unit 78 gives a velocity command to cancel an amount corresponding to the error to a velocity control unit 80 for the reticle stage 76. Thus the velocity control unit 80 performs velocity control for the reticle stage 76 on the basis of the velocity command and a velocity (detected value) of the reticle stage 76 obtained from the output of the laser interferometer 72.

In the conventional method for controlling stages described above, adjustment was performed by allowing the position of the reticle stage 76 to follow the position of the wafer stage 74. However, there has been an inconvenience that the response of the reticle stage 76 is delayed because the reticle stage 76 has a large weight. In addition, a vibration occurs on a vibration-preventive pedestal 82 on which the stages 74, 76 are placed resulting from a difference $(M_1 a_1 - M_2 a_2)$ between reaction forces of thrusts applied to the stages 74, 76 because the stages 74, 76 having large masses are subjected to scanning ($M_1$ and $M_2$ represent masses of the mask stage and the reticle stage respectively, and $a_1$ and $a_2$ represent accelerations during driving of the mask stage and the reticle stage respectively). Resulting from the vibration, fixed mirrors 84, 86 for each of the laser interferometers vibrate. In this situation, no problem arises if the fixed mirrors 84 vibrates identically to the fixed mirror 86. However, actually, the transfer function from the vibration-preventive pedestal 82 to each of the fixed mirrors 84, 86 is different, and hence, for example, the amplitude is different. For this reason, the positional error, which is a difference between measured values obtained by the interferometers 70, 72, includes an amount of an error resulting from the vibrations of the fixed mirrors 84, 86. Such a positional error is subjected to the feedback control as described above, on the basis of which the velocity control (positional control) is performed for the reticle stage 76. Accordingly, when the vibration is settled, the reticle stage 76 is discrepant with an original target position. Therefore, there has been an inconvenience that it takes time for the both stage to move to their original target positions and provide a desired synchronized state.

SUMMARY OF THE INVENTION

A first object of the present invention is to provide a method for controlling stages in which the inconvenience possessed by the conventional art as described above is dissolved, and the time required to regulate and establish synchronization between a substrate stage and a mask stage can be shortened.

A second object of the present invention is to provide an apparatus for controlling stages and a scanning type exposure apparatus provided therewith in which the time required to regulate and establish synchronization between a substrate stage and a mask stage can be shortened.

A third object of the present invention is to improve accuracy of synchronization between a substrate (a substrate state) and a mask (a mask stage).

According to a first aspect of the present invention, there is provided a method for controlling stages for an exposure apparatus comprising a mask stage for holding a mask, which is movable in a predetermined scanning direction, a substrate stage for holding a photosensitive substrate, which is movable in the scanning direction in synchronization with the mask stage, and a vibration-preventive pedestal for supporting the substrate stage, said method comprising:

making synchronized movement of the mask stage and the substrate stage in the predetermined scanning direction for scanning exposure;

detecting, during the synchronized movement, a positional discrepancy amount between the both stages, and calculating a vibration amount of the vibration-preventive pedestal; and controlling the movement of the both stages such that the positional discrepancy between the both stages is corrected on the basis of the detected positional discrepancy amount and the calculated vibration amount.

According to a second aspect of the present invention, there is provided a scanning type exposure method for an exposure apparatus comprising a mask stage for holding a mask, which is movable in a predetermined scanning direction, a substrate stage for holding a photosensitive substrate, which is movable in the scanning direction in synchronization with the mask stage, and a vibration-preventive pedestal for supporting the substrate stage, said method comprising:

irradiating the mask with illumination light;

performing exposure for the photosensitive substrate with a pattern on the mask by making synchronized movement of the mask stage and the substrate stage in the predetermined scanning direction;

detecting, during the synchronized movement of the mask stage and the substrate stage, a positional discrepancy amount between the both stages, and calculating a vibration amount of the vibration-preventive pedestal; and controlling the movement of the both stages such that positional discrepancy between the both stages is corrected on the basis of the detected positional discrepancy amount and the calculated vibration amount.

In the scanning type exposure apparatus, positions of the substrate stage and the mask stage are usually detected by laser interferometers. According to the method for controlling stages and the scanning type exposure method of the present invention, even when a vibration is generated on the vibration-preventive pedestal during acceleration to start the scanning for the both stages, an error in stage position affected by the vibration is taken into consideration, and correction is made at the predetermined time interval so that the positional relationship between the both stages becomes a predetermined synchronized relationship. Therefore, the both stages have arrived at a synchronized state when the vibration converges.

The vibration-preventive pedestal can be regarded as a secondary vibration system in the method for controlling stages and the scanning type exposure method of the present invention. The vibration amount of the vibration-preventive pedestal can be calculated at the predetermined time interval on the basis of a damping coefficient and a spring constant of the secondary vibration system and thrusts of the substrate stage and the mask stage.

According to a third aspect of the present invention, there is provided an apparatus for controlling stages to be used for an exposure apparatus comprising a mask stage for holding a mask, which is movable in a predetermined scanning direction, a substrate stage for holding a photosensitive substrate, which is movable in the scanning direction, and a vibration-preventive pedestal for supporting the substrate stage, said apparatus comprising:

a first stage control system for performing velocity control for one stage of the mask stage and the substrate stage; and a second stage control system for controlling the other stage in synchronization with the velocity control for the one stage so that the one stage and the other stage are in a predetermined positional relationship;

said second stage control system comprising:

a positional error-detecting means for detecting a positional error between the both stages;

a calculation means for calculating a vibration amount of the vibration-preventive pedestal; and a control means for performing velocity control for the other stage on the basis of the detected positional error and the calculated vibration amount.

According to the apparatus for controlling stages of the present invention, the first stage control system performs the velocity control for one stage of the mask stage and the substrate stage, for example, for the substrate stage. During this process, the second stage control system drives and controls the other stage, for example, the mask stage in synchronization with the velocity control for the substrate stage so that the both stages are in the predetermined positional relationship. In this operation, the positional error-detecting means, which constitutes the second stage control system, detects the positional error between the both stages, and the operation means calculates, at the predetermined time interval, the vibration amount of the vibration-preventive pedestal on which the substrate stage is placed. Thus the control means performs the velocity control for the mask stage on the basis of the detected positional error and the calculated vibration amount. Accordingly, for example, when the positions of the both stages are detected by laser interferometers, even if a vibration occurs on the vibration-preventive pedestal during acceleration for scanning the both stages, the error affected by the vibration is taken into consideration, and correction is made at the predetermined time interval so that the positional relationship between the both stages becomes a predetermined synchronized relationship. Therefore, the both stages have arrived at a synchronized state when the vibration converges.

According to a fourth aspect of the present invention, there is provided an apparatus for controlling stages to be used for an exposure apparatus comprising a mask stage for holding a mask, which is movable in a predetermined scanning direction, a substrate stage for holding a photosensitive substrate, which is movable in the scanning direction, and a vibration-preventive pedestal for supporting the substrate stage, said apparatus comprising:

the mask stage having a first stage which is movable in the scanning direction, and a second stage which is relatively movable on the first stage along the scanning direction;

a first velocity control system for performing velocity control for the substrate stage;

a second velocity control system for performing velocity control for the first stage; and a stage position control system for controlling the second stage for its position in synchronization with the velocity control by the first and second velocity control systems so that the substrate stage and the second stage are in a predetermined positional relationship;

said stage position control system comprising:

a positional error-detecting means for detecting a positional error between the substrate stage and the second stage;

a storage unit in which at least a damping coefficient and a spring constant of a secondary vibration system including the vibration-preventive pedestal are stored;

a calculation means for calculating a vibration amount of the vibration-preventive pedestal at a predetermined time interval on the basis of the damping coefficient, the spring constant, thrusts of the substrate stage and the first stage, and a transfer function of the secondary vibration system; and control means for performing positional control for the second stage on the basis of the detected positional error and the calculated vibration amount.

According to the apparatus for controlling stages described above, the first velocity control system performs the velocity control for the substrate stage, and the second velocity control system performs the velocity control for the first stage. During this process, the stage position control unit controls the position of the second stage in synchronization with the velocity control by the first and second velocity control systems so that the substrate stage and the second stage are in the predetermined positional relationship. In this operation, the positional error-detecting means, which constitutes the stage position control system, detects the positional error between the substrate stage and the second stage, and the operation means calculates, at the predetermined time interval, the vibration amount of the vibration-preventive pedestal on the basis of at least the damping coefficient and the spring constant of the secondary vibration system including the vibration-preventive pedestal on which the substrate stage is placed, the thrusts of the substrate stage and the first stage, and the transfer function of the secondary vibration system. Thus the control means performs the positional control for the second stage on the basis of the detected positional error and the calculated vibration amount. Accordingly, for example, when the positions of the substrate stage and the second stage are detected by laser interferometers, even if a vibration occurs on the vibration-preventive pedestal during acceleration for scanning the substrate stage and the first stage, the error affected by the vibration is taken into consideration, and correction is made at the predetermined time interval so that the positional relationship between the substrate stage and the second stage becomes a predetermined synchronized relationship. Therefore, the substrate stage and the second stage have arrived at a synchronized state when the vibration converges. Further, when the second stage is allowed to have a small mass, the position of the second stage can be controlled with good responsibility to follow the substrate stage.

According to a fifth aspect of the present invention, there is provided a scanning type exposure apparatus comprising:

a mask stage for holding a mask, which is movable in a predetermined scanning direction;

a substrate stage for holding a photosensitive substrate, which is movable in the scanning direction in synchronization with the mask stage;

a vibration-preventive pedestal for supporting the substrate stage;

a first stage control system for performing velocity control for one stage of the mask stage and the substrate stage;

a second stage control system for controlling the other stage in synchronization with the velocity control for the one stage so that the one stage and the other stage are in a predetermined positional relationship;

a positional error-detecting means for detecting a positional error between the both stages;

a calculation means for calculating a vibration amount of the vibration-preventive pedestal in the scanning direction; and a control means for performing velocity control for the other stage on the basis of the detected positional error and the calculated vibration amount.

According to a sixth aspect of the present invention, there is provided a method for controlling stages for an exposure apparatus comprising a mask stage for holding a mask, which is movable in a predetermined scanning direction, and a substrate stage for holding a photosensitive substrate, which is movable in the scanning direction in synchronization with the mask stage;

said mask stage comprising a first stage which is movable in the scanning direction, and a second stage which is relatively movable along the scanning direction on the first stage, and said method comprising:

making movement of the first and second stages and the substrate stage in the scanning direction for scanning exposure;

detecting a difference in velocity between the first stage and the substrate stage;

detecting a positional discrepancy amount between the second stage and the substrate stage; and making velocity control for the first stage and the substrate stage on the basis of the difference in velocity, and making positional control for the second stage on the basis of the positional discrepancy amount.

According to a seventh aspect of the present invention, there is provided an apparatus for controlling stages to be used for an exposure apparatus comprising a mask stage for holding a mask, which is movable in a predetermined scanning direction or directions, and a substrate stage for holding a photosensitive substrate, which is movable in the scanning direction in synchronization with the mask stage;

said mask stage comprising a first stage which is movable in the scanning direction, and a second stage which is relatively movable along the scanning direction on the first stage, and said apparatus comprising:

a velocity control system for performing velocity control for the first stage and the substrate stage; and a position control system for performing positional control for the second stage.

DETAILED DESCRIPTION OF THE PREFERRED EMBODIMENT

Figure 1:
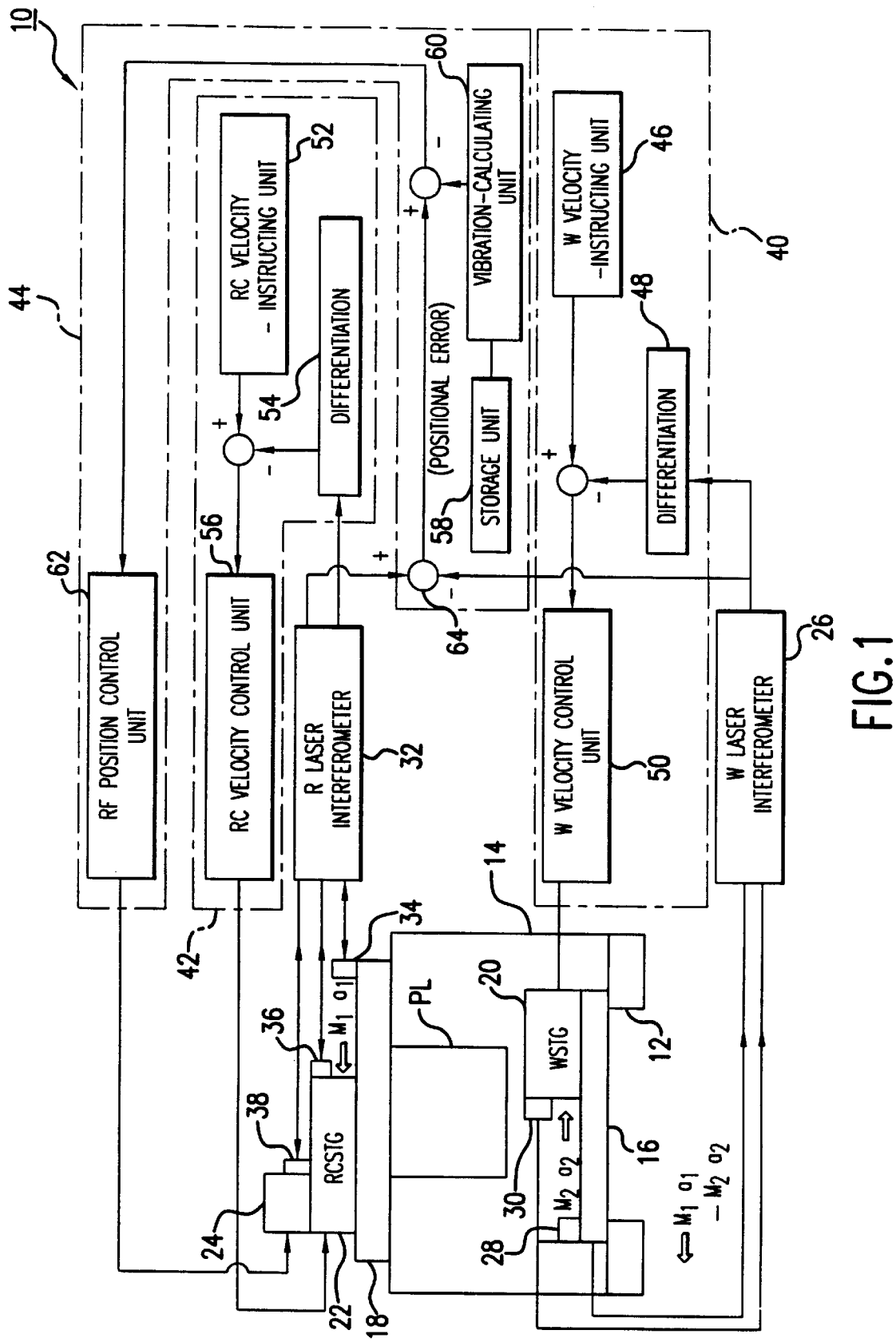
FIG. 1 shows a schematic arrangement of a scanning type exposure apparatus and an arrangement of an apparatus for controlling stages used therefor according to one embodiment of the present invention.
Figure 2:
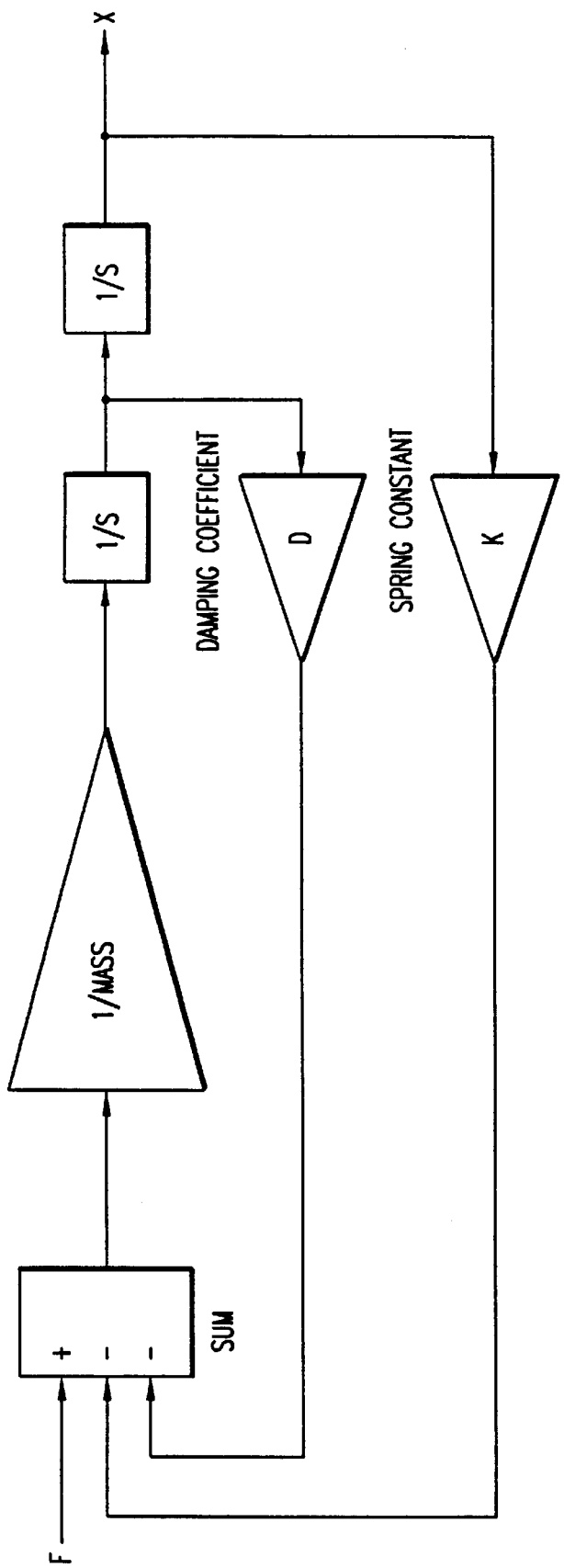
FIG. 2 shows a block diagram illustrating a secondary vibration system including a vibration-preventive pedestal and a main column body in FIG. 1.

An embodiment of the present invention will be explained below with reference to FIG. 1 to FIG. 3. The arrangement of a scanning type exposure apparatus of the present invention will be firstly explained. However, the principle and details of the arrangement of such a scanning type exposure apparatus are disclosed in U.S. Pat. Nos. 5,194,893 and 4,924,257. The content of the patent documents are incorporated herein by reference. FIG. 1 shows schematic arrangements of the scanning type exposure apparatus and an apparatus for controlling stages 10 applied thereto.

In FIG. 1, a main column body 14 and a wafer support stand 16 are placed on a vibration-preventive pedestal 12. A reticle support stand 18 is placed on the main column body 14.

A wafer stage (WSTG) 20 as a substrate stage is provided on the wafer support stand 16, which is movable in scanning directions (right and left directions in FIG. 1) and in directions perpendicular thereto (directions perpendicular to the plane of the paper in FIG. 1). A reticle coarse movement stage (RCSTG) 22 as a first stage having a large mass is provided on the reticle support stand 18, which is movable in the scanning directions (right and left directions in FIG. 1). A reticle fine movement stage (RFSTG) 24 as a second stage having a small mass is provided on the reticle coarse movement stage 22, which is finely movable in the scanning directions. Namely, in this embodiment, a mask stage is constituted as including the reticle coarse movement stage 22 and the reticle fine movement stage 24.

A projection optical system PL is arranged over the wafer stage 20 and held on the main column body 14, an optical axis of which is directed to a direction perpendicular to a movement plane of the wafer stage 20. A wafer as a photosensitive substrate is placed on the wafer stage 20, and a reticle as a mask is placed on the reticle fine movement stage 24. In this state, a pattern plane of the reticle is conjugate with a surface of the wafer relative to the projection optical system PL.

A fixed mirror 28 for a laser interferometer 26 for the wafer is provided at one end in the scanning direction (left end in FIG. 1) on the wafer support stand 16, which extends in a direction perpendicular to the scanning directions (direction perpendicular to the plane of the paper in FIG. 1). Corresponding to the fixed mirror 28, a movable mirror 30 for the laser interferometer 26 for the wafer is provided at one end in the scanning direction of the wafer stage 20, which extends in the direction perpendicular to the scanning directions.

In the same manner, a fixed mirror 34 for a laser interferometer 32 for the reticle is provided at one end in the scanning direction (right end in FIG. 1) on the reticle support stand 18, which extends in the direction perpendicular to the scanning directions (direction perpendicular to the plane of the paper in FIG. 1). Corresponding to the fixed mirror 34, first and second movable mirrors 36, 38 for the laser interferometer 32 for the reticle are provided at one ends in the scanning direction of the reticle coarse movement stage 22 and the reticle fine movement stage 24, which extend in the direction perpendicular to the scanning directions respectively.

The apparatus for controlling stages 10 comprises the laser interferometer 26 for the wafer for radiating laser beams to the fixed mirror 28 and the movable mirror 30 and receiving reflected beams therefrom to detect the position of the wafer stage 20, the laser interferometer 32 for the reticle for radiating laser beams to the fixed mirror 34 and the first and second movable mirrors 36, 38 and receiving reflected beams therefrom to detect the positions of the reticle coarse movement stage 22 and the reticle fine movement stage 24 respectively, a velocity control system 40 for the wafer stage as a first velocity control system, a velocity control system 42 for the reticle coarse movement stage as a second velocity control system, and a position control system 44 for the reticle fine movement stage as a stage position control system.

The velocity control system 40 for the wafer stage comprises a velocity-instructing unit 46 for the wafer stage, a differentiating circuit 48 for differentiating positional information on the wafer stage 20 as an output of the laser interferometer 26 and calculating a velocity of the wafer stage 20, and a velocity control unit 50 for the wafer stage for performing velocity control for the wafer stage 20 through a driving system (not shown) on the basis of a velocity command from the wafer velocity-instructing unit 46 and the velocity calculated in the differentiating circuit 48.

The velocity control system 42 for the reticle coarse movement stage comprises a velocity-instructing unit 52 for the reticle coarse movement stage, a differentiating circuit 54 for differentiating positional information on the reticle coarse movement stage 22 as one output of the laser interferometer 32 for the reticle and calculating a velocity of the reticle coarse movement stage 22, and a velocity control unit 56 for the reticle coarse movement stage for performing velocity control for the reticle coarse movement stage 22 through a driving system (not shown) on the basis of a velocity command from the velocity-instructing unit 52 for the reticle coarse movement stage and the velocity calculated in the differentiating circuit 54.

Further, the position control system 44 for the reticle fine movement stage comprises a storage unit 58 in which data for calculating the vibration amount of the vibration-preventive pedestal 12 are stored, a vibration-calculating unit 60 as an operation means for calculating the vibration amount of the vibration-preventive pedestal 12 by means of a technique described below on the basis of the data stored in the storage unit 58, and a position control unit 62 for the reticle fine movement stage as a control means for controlling the position of the reticle fine movement stage 24 on the basis of the calculated vibration amount and a positional error between the wafer stage 20 and the reticle fine movement stage 24. In this embodiment, the positional error between the wafer stage 20 and the reticle fine movement stage 24 is calculated by a subtracter 64 on the basis of the positional information on the wafer stage 20 as the output of the laser interferometer 26 for the wafer and positional information on the reticle fine movement stage 24 as the other output of the laser interferometer 32 for the reticle. Namely, in this embodiment, a positional error-detecting means is constituted by the laser interferometer 26 for the wafer, the laser interferometer 32 for the reticle, and the subtracter 64. The position of the reticle fine movement stage 24 is controlled by the position control unit 62 for the reticle fine movement stage through a driving system (not shown).

Next, a method for calculating the vibration amount of the vibration-preventive pedestal 12 by using the vibration-calculating unit 60 will be explained with reference to FIG. 2. FIG. 2 shows a block diagram of the vibration system described above in which the vibration-preventive pedestal 12 is considered as a secondary vibration system having a spring constant K and a damping coefficient D. When an equation of motion of this system is subjected to Laplace transform provided that all initial conditions are zero, the following expression (1) is obtained, which is a relational expression between an input F and an output X illustrated in the block diagram in FIG. 2.

$$X = 1/(Ms^2 + Ds + K) \cdot F \quad (1)$$

wherein:

$1/(Ms^2+Ds+K)$: transfer function of this vibration system;

M: mass of the apparatus including the vibration-preventive pedestal 12 and the main column body 14;

F: external force as the input of this vibration system;

X: position of the vibration-preventive pedestal as the output of this system (vibration amount); and s: time.

Figure 3:
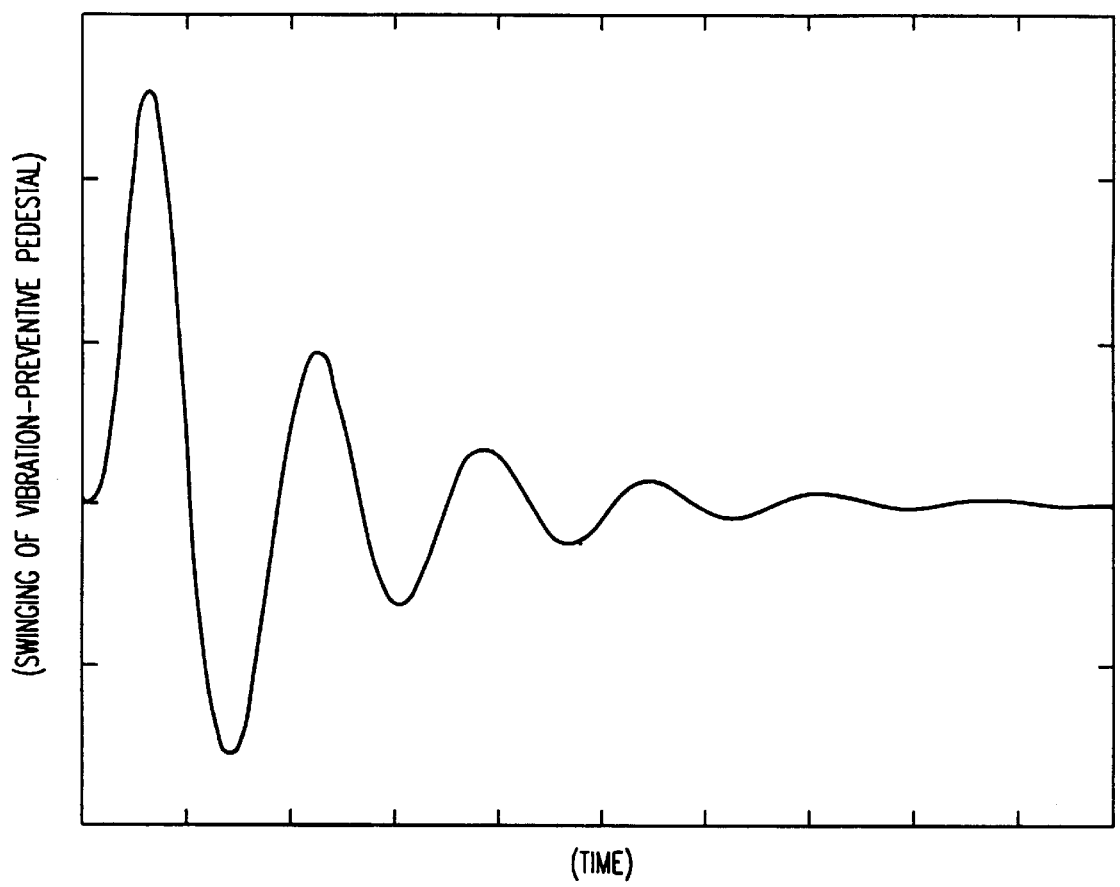
FIG. 3 shows a graph illustrating an example of simulation data of vibration of the vibration-preventive pedestal.

FIG. 3 shows an example of data of simulation performed by inputting the external force F applied to the system when the wafer stage 20 and the reticle fine movement stage 22 are subjected to scanning under the same condition as that in exposure while previously determining the spring constant K and the damping coefficient D of the vibration-preventive pedestal 12 by an experiment, and using values thereof. In FIG. 3, the axis of abscissa indicates time, and the axis of ordinate indicates swinging of the vibration-preventive pedestal, that is the vibration amount in the scanning directions.

In this embodiment, values of the spring constant K, the damping coefficient D, the mass of the reticle coarse movement stage $M_1$, and the mass of the wafer stage $M_2$ are previously stored in the storage unit 58. When the reticle coarse movement stage 22 and the wafer stage 20 are simultaneously accelerated in opposite directions for scanning exposure, the vibration-calculating unit 60 calculates the vibration amount X at a predetermined time interval in accordance with the expression (1) described above by using the external force F which is represented by a difference $(M_1 a_1 - M_2 a_2)$ between a thrust $M_1 a_1$ applied to the reticle coarse movement stage 22 and a thrust $M_2 a_2$ applied to the wafer stage 20 to determine the swinging of the vibration-preventive pedestal 12 (vibration amount in the scanning directions) X as shown in FIG. 3.

The mass of the reticle fine movement stage 24 is sufficiently smaller than the mass of the reticle coarse movement stage 22, and hence it can be neglected when the external force F is determined.

In this procedure, the thrust $M_1 a_1$ and the thrust $M_2 a_2$ are determined by multiplying an acceleration $a_1$ of the reticle coarse movement stage 22 and an acceleration $a_2$ of the wafer stage 20 by masses $M_1$, $M_2$ of each of the stages respectively.

Alternatively, as another technique, it is also possible to perform simulation as described above under the same condition as that in exposure, store a result thereof in the storage unit 58 in a form of map, and calculate the vibration amount on the basis of the map at a predetermined time interval during scanning exposure.

According to this embodiment constructed as described above, the velocity-instructing unit 52 for the reticle coarse movement stage and the velocity-instructing unit 46 for the wafer stage generate velocity commands for the velocity control units 56, 50 respectively upon the start of scanning for the stages.

The velocity control unit 56 for the reticle coarse movement stage and the velocity control unit 50 for the wafer stage start velocity control for the reticle coarse movement stage 22 and the wafer stage 20 respectively in response to the velocity commands.

When the scanning for the stages is started as described above, the velocity control unit 56 for the reticle coarse movement stage and the velocity control unit 50 for the wafer stage continue the velocity control in accordance with the technique described above on the basis of the velocity commands and the detected velocities.

At this time, the positions of the wafer stage 20 and the reticle coarse movement stage 24 are monitored by the interferometers 26, 32 respectively. The positional error between the both stages 20, 24 is calculated on the basis of positional information thereon in the position control system 44 for the reticle fine movement stage. Simultaneously, the vibration-calculating unit 60 calculates the vibration amount of the vibration-preventive pedestal 12 resulting from the difference $(M_1 a_1 - M_2 a_2)$ between reaction forces of the thrusts for acceleration of the wafer stage 20 and the reticle coarse movement stage 22 having a large mass at the predetermined time interval in accordance with the technique described above. The position control unit 62 for the reticle fine movement stage controls the position of the reticle fine movement stage 24 on the basis of the positional error between the both stages 20, 24 and the calculated vibration amount of the vibration-preventive pedestal 12 in the scanning directions.

The positional error based on the outputs of the interferometers 26, 32 includes an error due to swinging of the fixed mirrors 28, 34 resulting from the vibration of the vibration-preventive pedestal 12. However, in this embodiment, the vibration amount is calculated by the vibration-calculating unit 60, and the position control unit 62 for the reticle fine movement stage controls the position of the reticle fine movement stage 24 on the basis of the positional error based on the outputs of the interferometers 26, 32 and the calculated vibration amount. Accordingly, the position of the reticle fine movement stage 24 is controlled in a stage in which the influence of the vibration is canceled. Thus the reticle fine movement stage 24 can be already positioned at a target position when the vibration converges. Therefore, the time required to regulate and establish synchronization between the wafer stage 20 and the reticle fine movement stage 24 upon completion of acceleration can be shortened, and thus the processing speed of the exposure apparatus is increased to make it possible to increase throughput of devices formed on wafers. In addition, it is possible to shorten the run-up distance of each of the stages until the wafer stage 20 and the reticle fine movement stage 24 are in a desired synchronized stage. Thus the apparatus can be miniaturized.

In the embodiment described above, an example has been illustrated in which the positional information from the laser interferometers 26, 32 is differentiated to make conversion into the velocity information. However, the movement velocities of the stages may be directly detected by using velocity-detecting means such as tachogenerators or the like.

In the embodiment described above, each of the units, which constitutes, for example, the velocity control system 40 for the wafer stage, the velocity control system 42 for the reticle coarse movement stage, and the position control system 44 for the reticle fine movement stage, has been illustrated as those included in different functional blocks respectively. However, it is also possible, by using a function of a single processor, to realize each of the velocity control system 40 for the wafer stage, the velocity control system 42 for the reticle coarse movement stage, and the position control system 44 for the reticle fine movement stage as a matter of course, as well as all of the three systems.

Figure 4:
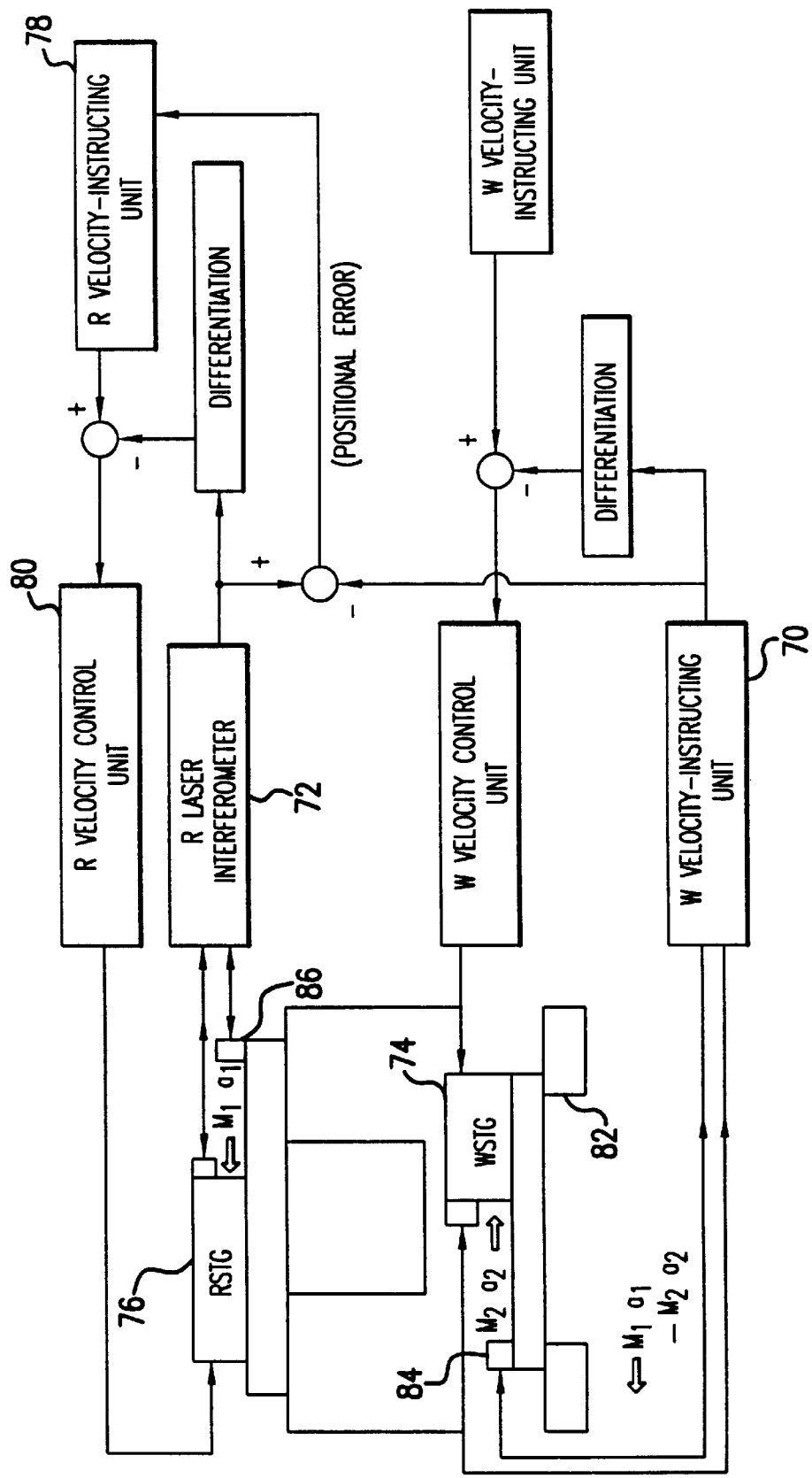
FIG. 4 shows an arrangement of an apparatus for controlling stages used for a conventional scanning type exposure apparatus.

In the embodiment described above, an example has been illustrated in which the reticle stage is constituted as including the reticle coarse movement stage 22 for which only the velocity control is performed and the reticle fine movement stage 24 for which the correction for the positional discrepancy error is performed, the first stage control system is constituted by the velocity control system 40 for the wafer stage, and the second stage control system is constituted by the velocity control system 42 for the reticle coarse movement stage and the position control system 44 for the reticle fine movement stage. However, it is also effective to apply the above mentioned method according to the invention which controls the stages based on a vibration amount of a vibration-preventive pedestal to apparatuses such as the apparatus of the conventional example in FIG. 4. In such a case, the reticle stage and the wafer stage are simultaneously subjected to velocity control, and a positional error (or a velocity error) between the both stages is sent in a feedback manner to one of the velocity control systems for any of the stages. However, in such a procedure, the error includes errors in detected values by the interferometers resulting from the vibration of the vibration-preventive pedestal. Accordingly, the velocity control for the stages is performed in a state in which amounts of the errors in the detected values by the interferometers resulting from the vibration of the vibration-preventive pedestal are canceled by using the vibration amount calculated by the vibration-calculating unit. Thus it becomes possible to shorten the time required to regulate and establish synchronization between the both stages.

In the embodiment described above, it is also available to optionally set a period of time (or interval) for using the vibration amount of the vibration-preventive pedestal 12 for controlling the fine movement stage 24, instead of using the vibration amount of the vibration-preventive pedestal 12 for controlling the fine movement stage 24 at the predetermined time interval until completion of the vibration. By doing so, the fine movement stage 24 is prevented from extra movement, and it is possible to accurately control the time required to regulate and establish synchronization.

As described above, according to the present invention, for example, when the positions of the mask stage and the substrate stage are detected by using the laser interferometers, even if the vibration occurs on the vibration-preventive pedestal during acceleration for scanning for the both stages, the both stages are in a asynchronized state when the vibration converges. Accordingly, an excellent effect, which has not been obtained in the conventional art, is obtained that the time required to regulate and establish synchronization between the substrate stage and the mask stage can be shortened. Further, in the embodiment, the mask stage is divided into the first stage for coarse movement and the second stage for fine movement so that the positional discrepancy is adjusted by using the second stage having a small mass. Thus an effect is also obtained that the position of the reticle can be controlled with good responsibility to follow the photosensitive substrate.

The present invention may be practiced or embodied in other various forms without departing from the spirit or essential characteristics thereof. It will be understood that the scope of the present invention is indicated by the appended claims, and all variations and modifications which come within the equivalent range of the claims are embraced in the scope of the present invention.

What is claimed is:

1. A method for controlling stages for an exposure apparatus comprising a mask stage for holding a mask, which is movable in at least one predetermined scanning direction, a substrate stage for holding a substrate, which is movable in the at least one scanning direction in synchronization with the mask stage, and a vibration-preventive pedestal for supporting the substrate stage, said method comprising:

synchronously moving the mask stage and the substrate stage in the at least one predetermined scanning direction for scanning exposure;

detecting, during the moving, a positional discrepancy amount between the mask stage and the substrate stage, and calculating a vibration amount of the vibration-preventive pedestal; and controlling the moving of the mask stage and the substrate stage such that the positional discrepancy between the stages which is detected during the moving of the stages is corrected on the basis of the detected positional discrepancy amount and the calculated vibration amount.

2. The method for controlling stages according to claim 1, wherein the vibration-preventive pedestal is regarded as a secondary vibration system, and the vibration amount of the vibration-preventive pedestal is calculated at a predetermined time interval on the basis of a damping coefficient and a spring constant of the secondary vibration system, and thrusts of the substrate stage and the mask stage.

3. A scanning type exposure method for an exposure apparatus comprising a mask stage for holding a mask, which is movable in a predetermined scanning direction, a substrate stage for holding a substrate, which is movable in the scanning direction in synchronization with the mask stage, and a vibration-preventive pedestal for supporting the substrate stage, said method comprising:

irradiating the mask with illumination light;

performing exposure for the substrate with a pattern on the mask by synchronously moving the mask stage and the substrate stage in the predetermined scanning direction;

detecting, during the moving of the mask and the substrate stage, positional discrepancy amount between the stages, and calculating a vibration amount of the vibration-preventive pedestal; and controlling the moving of the mask stage and the substrate stage such that positional discrepancy between the stages which is detected during the moving of the stages is corrected on the basis of the detected positional discrepancy amount and the calculated vibration amount.

4. The scanning type exposure method according to claim 3, wherein the vibration-preventive pedestal is regarded as a secondary vibration system, and the vibration amount of the vibration-preventive pedestal is calculated at a predetermined time interval on the basis of a damping coefficient and a spring constant of the secondary vibration system, and thrusts of the substrate stage and the mask stage.

5. The scanning type exposure method according to claim 3, wherein the mask stage and the substrate stage are supported by the vibration-preventive pedestal, and the positional discrepancy amount between the mask stage and the substrate stage is determined from a difference between outputs of interferometer systems that measure positions of each of the stages.

6. An apparatus for controlling stages to be used for an exposure apparatus comprising a mask stage for holding a mask, which is movable in a predetermined scanning direction, a substrate stage for holding a substrate, which is movable in the scanning direction, and a vibration-prevention pedestal for supporting the substrate stage, said apparatus comprising:

a first stage control system that is electrically connected to one stage of the mask stage and the substrate stage and that performs velocity control for the one stage; and a second stage control system that is electrically connected to the other stage, and controls the other stage in synchronization with the velocity control for the one stage so that the one stage and the other stage are in a predetermined positional relationship;

said second stage control system comprising:

a positional error-detecting device that detects a positional error between the mask stage and the substrate stage during the controlling of the first and second stage control systems;

a calculation device that is electrically connected to the vibration-preventive pedestal, and that calculates a vibration amount of the vibration-preventive pedestal; and a controller that is electrically connected to the positional error-detecting device and the calculation device, and that controls the velocity of the other stage on the basis of the positional error detected during the controlling of the first and second stage control systems and the calculated vibration amount.

7. The apparatus for controlling stages according to claim 6, wherein the first stage control system performs the velocity control for the substrate stage, and the second stage control system controls the mask stage in synchronization with the velocity control for the substrate stage so that the substrate stage and the mask stage are in the predetermined positional relationship.

8. An apparatus for controlling stages to be used for an exposure apparatus comprising a mask stage for holding mask, which is movable in a predetermined scanning direction, a substrate stage for holding a substrate, which is movable in the scanning direction, and a vibration-preventive pedestal for supporting the substrate stage, said apparatus comprising:

the mask stage having a first stage which is movable in the scanning direction, and a second stage which is relatively movable on the first stage along the scanning direction;

a first velocity control system that is electrically connected to the substrate stage, and that performs velocity control for the substrate stage;

a second velocity control system that is electrically connected to the first stage, and that performs velocity control for the first stage; and a stage position control system that is electrically connected to the first and second velocity control systems and the second stage, and that controls the position of the second stage in synchronization with the velocity control by the first and second velocity control systems so that the substrate stage and the second stage are in predetermined positional relationship;

said stage position control system comprising:

a positional error-detecting device that detects a positional error between the substrate stage and the second stage;

a memory in which at least a damping coefficient and a spring constant of a secondary vibration system including the vibration-preventive pedestal are stored;

a calculation device that is electrically connected to the vibration-preventive pedestal and the memory, and that calculates a vibration amount of the vibration-preventive pedestal at a predetermined time interval on the basis of the damping coefficient, the spring constant, thrusts of the substrate stage and the first stage, and a transfer function of the secondary vibration system; and a controller that is electrically connected to the positional error-detecting device and calculation device and the second stage, and that controls the position of the second stage on the basis of the detected positional error and the calculated vibration amount.

9. A scanning type exposure apparatus comprising:

a mask stage which holds a mask and is movable in a predetermined scanning direction;

a substrate stage which holds a substrate and is movable in the scanning direction in synchronization with the mask stage;

a vibration-preventive pedestal that supports the substrate stage;

a first stage control system that is electrically connected to one stage of the mask stage and the substrate stage and that performs velocity control for the one stage;

a second stage control system that is electrically connected to the other stage, and that controls the other stage in synchronization with the velocity control for the one stage so that the one stage and the other stage are in a predetermined positional relationship.

a positional error-detecting device that detects a positional error between the mask stage and substrate stage during the controlling of the first and second stage control systems;

a calculation device that is electrically connected to the vibration-preventive pedestal, and that calculates a vibration amount of the vibration-preventive pedestal in the scanning direction; and a controller that is electrically connected to the positional error-detecting device and the calculation device and that controls the velocity of the other stage on the basis of the positional error detected during the contrlling of the first and second stage control systems and the calculated vibration amount.

10. The scanning type exposure apparatus according to claim 9, wherein:

the mask stage comprises a first stage which is movable in the scanning direction, and a second stage which is relatively movable on the first stage along the scanning direction; the first stage control system performs the velocity control for the substrate stage; the second stage control system comprises a velocity control system for the first stage and a position control system for the second stage; the positional error-detecting device detects a positional error between the substrate stage and the second stage; and the position control system for the second stage performs positional control for the second stage on the basis of the detected positional error and the calculated vibration amount.

11. The scanning type exposure apparatus according to claim 9, wherein the vibration-preventive pedestal is regarded as a secondary vibration system, and the vibration amount of the vibration-preventive pedestal is calculated on the basis of a damping coefficient and a spring constant of the secondary vibration system, and thrusts of the substrate stage and the mask stage.

12. An exposure apparatus for exposing a substrate with a pattern formed on a mask while moving the mask and substrate synchronously, comprising:

a mask stage that holds the mask;

a substrate stage that holds the substrate;

a supporting member that supports at least one of the mask stage and the substrate stage;

a detecting device that detects a positional discrepancy of the mask stage relative to the substrate stage during the synchronous movement of the mask and the substrate; and a control system that is electrically connected to the mask stage and the substrate stage and that corrects a positional discrepancy of the mask stage relative to the substrate stage, which is detected by the detecting device, during the synchronous movement of the mask and the substrate, based on information on a vibration of the supporting member.

13. The exposure apparatus according to claim 12, wherein the control system controls the mask stage based on the information on the vibration of the supporting member.

14. The exposure apparatus according to claim 13, wherein the mask stage comprises a coarse movement stage and a fine movement stage, and the control system controls the fine movement stage based on the information on the vibration of the supporting member.

15. The exposure apparatus according to claim 12, further comprising a laser interferometer that measures a position of at least one of the mask stage and the substrate stage, and wherein the supporting member is provided with a fixed mirror for the laser interferometer.

16. The exposure apparatus according to claim 12, wherein the information on the vibration includes a transfer function of the supporting member.

17. The exposure apparatus according to claim 12, wherein the information on the vibration includes a vibration map of the supporting member under the substantially same condition as in exposure.

18. The exposure apparatus according to claim 12, wherein the information on the vibration includes a force applied to the supporting member when an acceleration in a certain direction is provided to at least one of the mask stage and the substrate stage.

19. An exposure method for exposing a substrate with a pattern formed on a mask while moving a mask stage for holding the mask and a substrate stage for holding the substrate synchronously, comprising:
   obtaining information on a vibration of a supporting member which supprts at least one of the mask stage and the substrate stage;
   detecting a positional discrepancy of the mask stage relative to the substrate stage during the synchronous movement of the mask and the substrate; and
   correcting the detected positional discrepancy of the mask stage relative to the substrate stage, during the synchronous movement of the mask stage and the substrate stage, based on information on the vibration of the supporting member.

20. The exposure method according to claim 19, wherein the positional discrepancy of the mask stage relative to the substrate stage is corrected by controlling the mask stage.

21. The exposure method according to claim 20, wherein the mask stage comprises a coarse movement stage and a fine movement stage, and a positional discrepancy of the fine movement stage relative to the substrate stage is corrected by controlling the fine movement stage.

22. A method for controlling a first stage for holding a first object and a second stage for holding a second object to move the first and second stages synchronously, comprising:
   obtaining information on a vibration of a supporting member that supports at least one of the first stage and the second stage;
   detecting a positional discrepancy of the first stage relative to the second stage during the synchronous movement of the first stage and the second stage; and
   controlling a position of the first stage relative to the second stage, during the synchronous movement of the first and second stages, based on information on a vibration of the supporting member and the positional discrepancy detected during the synchronous movement of the first stage and the second stage.

23. The method according to claim 22, wherein the first stage comprises a coarse movement stage and a fine movement stage, and a position of the fine movement stage relative to the ssecond stage is controlled by controlling the fine movement stage.

24. The method according to claim 22, wherein the information on the vibration includes a transfer function of the supporting member.

25. The method according to claim 22, wherein the information on the vibration includes a vibration map of the supporting member under a substantially same condition as in exposure.

26. The method according to claim 22, wherein the information on the vibration includes information on a force applied to the supporting member when an acceleration in a certain direction is provided to at least one of the first stage and the second stage.

27. The method according to claim 22 wherein controlling a position of the first stage relative to the second stage includes correcting the positional discrepancy of the first stage relative to the second stage.

28. The method according to claim 22, wherein controlling a position of the first stage relative to the second stage includes controlling a velocity of the first stage and controlling a velocity of the second stage based on a positional discrepancy between the first stage and the second stage.

29. The method according to claim 22, further comprising:
   detecting a positional error between the first stage and the second stage; and
   calculating a vibration amount of the supporting member based on a damping coefficient, a spring constant, thursts of the first stage and the second stage, and a transfer function of the supporting member, wherein controlling a position of the first stage relative to the second stage includes controlling the second stage based on the detected positional error and the calculated vibration amount.

30. An exposure apparatus, comprising:
   a first stage;
   a second stage;
   a detecting device that detects a positional discrepancy of the first stage relative to the second stage during a movement of at least one of the first stage and the second stage;
   a calculation device that calculates information on a vibration amount of a support member of the at least one of the first stage and the second stage; and
   a controller that is electrically connected to the first and second stages and to the calculation device, wherein the controller corrects the detected positional discrepancy of the first stage relative to the second stage based on the information on the vibration of the support member of the at least one of the first stage and the second stage.

31. The exposure apparatus according to claim 30, wherein the information on the vibration includes a transfer function of the support member.

32. The exposure apparatus according to claim 30, wherein the information on the vibration includes a vibration map of the supprt member under a substantially same condition as in exposure.

33. The exposure apparatus according to claim 30, wherein the information on the vibration includes information on a force applied to the support member when an acceleration in a certian direction is provided to at least one of the first stage and the second stage.

34. The exposure apparatus according to claim 30, wherein the first stage includes a coarse movement stage and a fine movement stage, and the controller controls a position of the fine movement stage relative to the second stage by controlling the fine movement stage.

35. The exposure apparatus according to claim 30, whereint he controlelr corrects a positional discrepancy of the first stage relative to the second stage by controlling a velocity of the first stage and controlling a velocity of the second stage based on the positional discrepancy between the first stage and the second stage.

36. The exposure apparatus according to claim 30, further comprising:

a positional error detector electrically connected to the controller, that detects a positional error between the first stage and the second stage; and a vibration calculator electrically connected to the controller, that calculates a vibration of the support member based on a damping coefficient, a spring constant, thursts of the first stage and the second stage, and a transfer function of the support member, wherein the controller corrects a positional discrepancy of the first stage relative to the second stage by controlling the second stage based on the detected positional error and the calculated vibration.

37. A method for maing an exposure apparatus, comprising:

providing a first stage;

providing a second stage;

providing a detecting device that detects a positional discrepancy of the first stage relative to the second stage during a movement of at least one of the first stage and the second stage;

providing a support member of at least one of the first stage and the second stage;

providing a calculation device that calculates information on a vibration amount of the support member; and providing a controller that, when in operation, corrects the detected positional discrepancy of the first stage relative to the second stage based on the information on the vibration of the support member of the at least one of the first stage and the second stage.

38. The method according to claim 37, wherein the information on the vibration includes a transfer function of the support memer.

39. The method according to claim 37, wherein the information on the vibration includes a vibration map of the support member under a substantially same condition as in exposure.

40. The method according to claim 37, wherein the information on the vibration includes information on a force applied to the support member when an accelearation in a certain direction is provided to at least one of the first stage and the second stage.

41. The method according to claim 37, wherein the first stage includes a coarse movement stage and a fine movement stage, and the controller controls a position of the fine movement stage relative to the second stage by controlling the fine movement stage.

42. The method according to claim 37, wherein the controller corrects a positional discrepancy of the first stage relative to the second stage by controlling a velocity of the first stage and controlling a velocity of the second stage based on the positional discrepancy between the first stage and second stage.

43. The method according to claim 37, further comprising:

providing a positional error detector that, when in operation, detects a positional error between the first stage and the second stage; and providing a vibration calculator that, when in operation, calculates a vibration of the support member based on a damping coefficient, a spring constant, thrusts of the first stage and the second stage, and a transfer function of the support member, wherein the controller corrects a positional discrepancy of the first stage relative to the second stage by controlling the second stage based on the detected positional error and the calculated vibration.

44. The method according to claim 1, wherein, in the controlling of the moving of the mask stage and the substrate stage, the calculated vibration amount is canceled from the detected positional discrepancy amount.

45. The method according to claim 3, wherein, in the controlling of the moving of the mask stage and the substrate stage, the calculated vibration amount is canceled from the detected positional discrepancy amount.

46. The apparatus according to claim 6, wherein the contrller controls the velocity of the other stage so that the positional error detected during the controlling is corrected based on the calculated vibration amount of the vibration-preventive pedestal.

47. The apparatus according to claim 46, wherein the controller corrects the positional error by canceling the calculated vibration amount of the vibration-preventive pedestal from the positional error detected during the controlling.

48. The scanning type exposure apparatus according to claim 9, wherein the controller controls the velocity of the other stage so that the positional error detected during the controlling is corrected based on the calculated vibration amount of the vibration-preventive pedestal.

49. The scanning type exposure apparatus according to claim 48, wherein the controller corrects the positional error by caneling the calculated vibration amount of the vibration-preventive pedestal from the positional error detected during the controlling.

50. The method according to claim 22, wherein the position of the first stage relative to the second stage is controlled so that the detected positional discrepancy of the first stage relative to the second stage is corrected based on the information on the vibration of the supporting member.

51. A method for controlling a first stage and a second stage comprising:

determining a positional discrepancy of the first stage relative to the second stage with a detecting device;

canceing a component of the positional discrepancy, which results from vibration of at least part of the detecting device, from the determined positional discrepancy; and driving the first stage relative to the second stage based on the positional discrepancy from which the component of the positional discrepancy that resulted from the vibration has been cancelled.

52. The method according to claim 51, wherein the vibration occurs while a velocity of at least one of the first stage and second stage is controlled.

53. The method according to claim 52, wherein the component of the positional discrepancy which results from the vibration is determined by calculation.

54. The method according to claim 53, wherein the determine component is stored into a memory.

* * * * *

UNITED STATES PATENT AND TRADEMARK OFFICE
CERTIFICATE OF CORRECTION

PATENT NO.    : 6,285,437 B1  
DATED         : September 4, 2001  
INVENTOR(S)   : Masateru Tokunaga It is certified that error appears in the above-identified patent and that said Letters Patent is hereby corrected as shown below:

<u>Title page,</u>  
Insert: -- [30]   Foreign Application Priority Data  
              April 21, 1995 (JP).......................... 7-120825 --

<u>Column 17,</u>  
Line 13, change "maing" to -- making --.

<u>Column 18,</u>  
Line 45, change "canceing" to -- canceling --.

Signed and Sealed this

Twenty-fourth Day of September, 2002

Attest:

Attesting Officer

JAMES E. ROGAN  
Director of the United States Patent and Trademark Office